United States Patent [19]

Metz et al.

[11] Patent Number: 4,947,061
[45] Date of Patent: Aug. 7, 1990

[54] CMOS TO ECL OUTPUT BUFFER CIRCUIT

[75] Inventors: Peter C. Metz, Emmaus; Robert L. Pritchett, Bath, both of Pa.

[73] Assignee: AT&T Bell Laboratories, Murray Hill, N.J.

[21] Appl. No.: 310,407

[22] Filed: Feb. 13, 1989

[51] Int. Cl.⁵ ............... H03K 19/092; H03K 19/086; H03K 19/003; H03K 17/10

[52] U.S. Cl. .................... 307/475; 307/455; 307/356; 307/358

[58] Field of Search ............... 307/475, 455, 355, 356, 307/358, 264, 260, 551, 443, 362, 363, 279, 247.1

[56] References Cited

U.S. PATENT DOCUMENTS

| | | | |
|---|---|---|---|
| 4,792,704 | 12/1988 | Lobb et al. | 307/475 X |
| 4,794,282 | 12/1988 | Colles | 307/475 |
| 4,797,583 | 1/1989 | Ueno et al. | 307/475 |
| 4,800,303 | 1/1989 | Graham et al. | 307/475 X |
| 4,806,799 | 2/1989 | Pelley, III et al. | 307/475 |

OTHER PUBLICATIONS

Fairchild F100K ECL Data Book, pp. 3-38 to 3-40 (1986).
IEEE International Solid State Circuits Conference Digest of Technical Papers, "A 2 μm CMOS Digital Adaptive Equalizer Chip for QAM Digital Radio Modems," by S. Meier, E. DeMan, T. G. Noll, U. Loibl, and H. Klar, pp. 64-65 and 302-303 (1988).
IEEE Journal of Solid State Circuits, "A 140 Mbit/s CMOS LSI framer Chip for a Broad-Band ISDN Local Access System," by H. J. Chao, T. J. Robe, and L. S. Smoot, pp. 133-141 (1988).
Unpublished, "A CMOS VLSI Framer Chip for a Broadband ISDN Local Access System", by H. J. Chao, T. J. Robe, and L. S. Smoot, pp. 1-15 and FIGS. 1-13.

Primary Examiner—Stanley D. Miller
Assistant Examiner—David R. Bertelson
Attorney, Agent, or Firm—Lester H. Birnbaum

[57] ABSTRACT

Disclosed is an output buffer circuit which converts from CMOS to ECL voltage levels using only CMOS technology. An external resistor provides the buffer with reference voltage levels in combination with a reference circuit. The high and low voltage references are coupled to the gates of separate biasing transistors in separate branches of the buffer circuit. A third transistor controls whether one or both branches will be coupled to the buffer output. In the first case, the low voltage level is established, and in the second case, the high voltage level is set. Additional transistors can be provided to remove charge buildup on the third transistor.

10 Claims, 3 Drawing Sheets

4,947,061

CMOS TO ECL OUTPUT BUFFER CIRCUIT

BACKGROUND OF THE INVENTION

This invention relates to output buffer circuits.

In many systems, especially those requiring high speed data links, a need exists to provide effective interconnection between integrated circuit chips employing CMOS (Complementary Metal Oxide Silicon) technology and chips employing ECL (Emitter Coupled Logic) circuitry. The problem arises because CMOS circuits generally operate with logic swings between 0→5 volts, while ECL chips operate with logic swings between −0.95→−1.7 volts.

A traditional method of achieving the appropriate voltage swing is to provide a bipolar buffer circuit in a chip which is external to the CMOS chip (see, e.g., Fairchild F100K ECL Data Book, pp. 3-38 to 3-40 (1986)). It would be more desirable based on performance and cost factors to provide a CMOS output buffer incorporated into the CMOS chip itself for interconnection with an ECL chip.

Some suggestions have been made recently to provide a CMOS output buffer circuit. For example, in Meier, "A 2 μm CMOS Digital Adaptive Equalizer Chip . . . ," *IEEE International Solid State Circuits Conference Digest of Technical Papers*, pp. 64-65 and 302-303 (1988), the lower level voltage is established by an external power supply. The upper voltage level is set by an MOS transistor acting as a current source which mirrors the current through a series of transistors in another branch. Thus, only the upper voltage level is controlled by the circuit.

It is, therefore, an object of the invention to provide as part of a CMOS integrated circuit chip an output buffer circuit which accurately sets voltage levels for connection with ECL logic chips.

SUMMARY OF THE INVENTION

These and other objects are achieved in accordance with the invention which is an output buffer circuit. A first MOS transistor is provided in a first branch of the circuit and a second MOS transistor is provided in a second branch of the circuit. A third MOS transistor is also provided in the second branch and adapted to turn on and off the current through the second branch. The two branches are coupled in parallel so that the output voltage of the first branch when current in the second branch is turned off provides one voltage level for an emitter coupled logic circuit connected to the output of the branches, and the output of the two branches when the current in the second branch is turned on provides another voltage level for the emitter coupled logic circuit connected to the output. The transistors are integrated into a single semiconductor chip. A resistor is also provided external to the chip for supplying reference voltages to the output buffer circuit.

BRIEF DESCRIPTION OF THE DRAWING

These and other features of the invention are delineated in detail in the following description. In the drawing.

DETAILED DESCRIPTION

Figure 1:
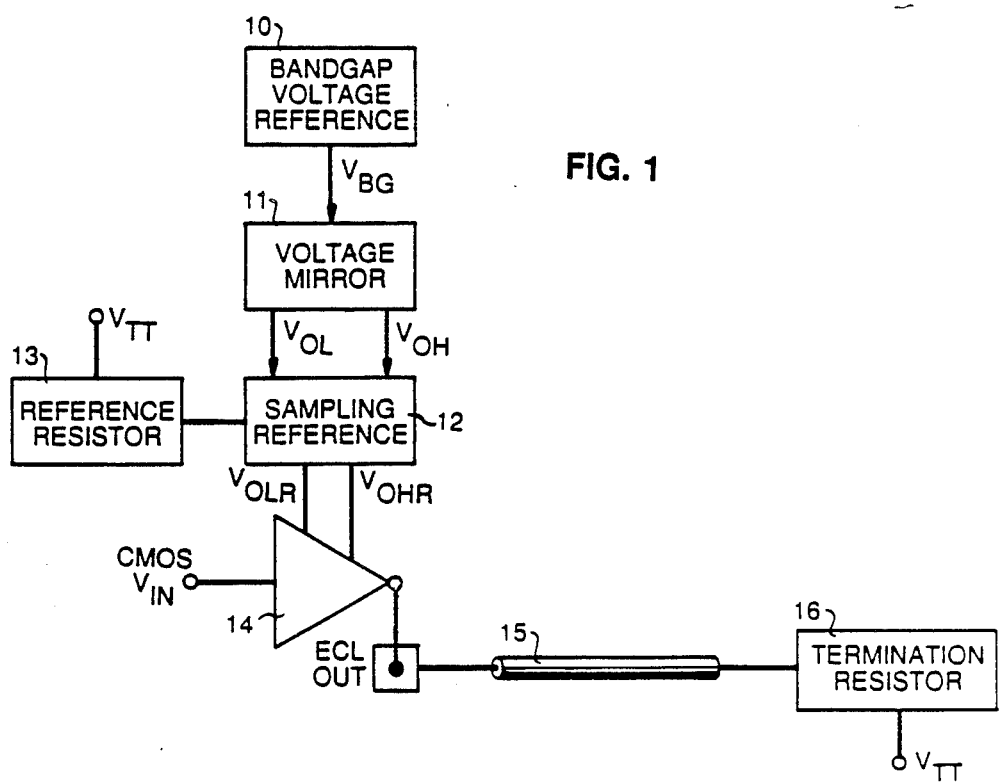
FIG. 1 is a schematic block diagram of a circuit incorporating an output buffer in accordance with an embodiment of the invention.

FIG. 1 illustrates and overall view of a circuit which includes conversion of CMOS voltage levels to ECL voltage levels. A standard bandgap voltage reference circuit, 10, generates a voltage $V_{BG}$ which is independent of temperature and power supply voltage. The bandgap reference circuit is coupled to a standard voltage mirror circuit, 11, where $V_{BG}$ is converted to low and high voltages, $V_{OL}$ and $V_{OH}$, respectively. Typically, $V_{BG}$ is approximately $V_{SS} + 1.23$ volts, while $V_{OL}$ is approximately $V_{DD} - 1.7$ volts and $V_{OH}$ is approximately $V_{DD} - 0.95$ volts. $V_{SS}$ is the most negative supply voltage to the CMOS chip (typically −5 volts) and $V_{DD}$ is the most positive voltage (typically 0 volts).

These circuits are fairly standard in the art and are therefore not discussed in detail.

The voltages, $V_{OL}$ and $V_{OH}$ are coupled to a sampling reference circuit 12 which, together with a reference resistor 13, provide low and high reference voltages, $V_{OLR}$ and $V_{OHR}$, respectively, for the output buffer circuit, 14. $V_{OLR}$ is typically −1.44 volts and $V_{OHR}$ is typically −1.50 volts. The buffer circuit, 14, receives CMOS voltage levels at its input terminal designated "CMOS In" from the CMOS integrated circuit chip and converts to voltage levels compatible with ECL chips at its output designated "ECL Out." The signal is sent along a transmission path, 15, to same ECL chip (not shown).

Figure 2:
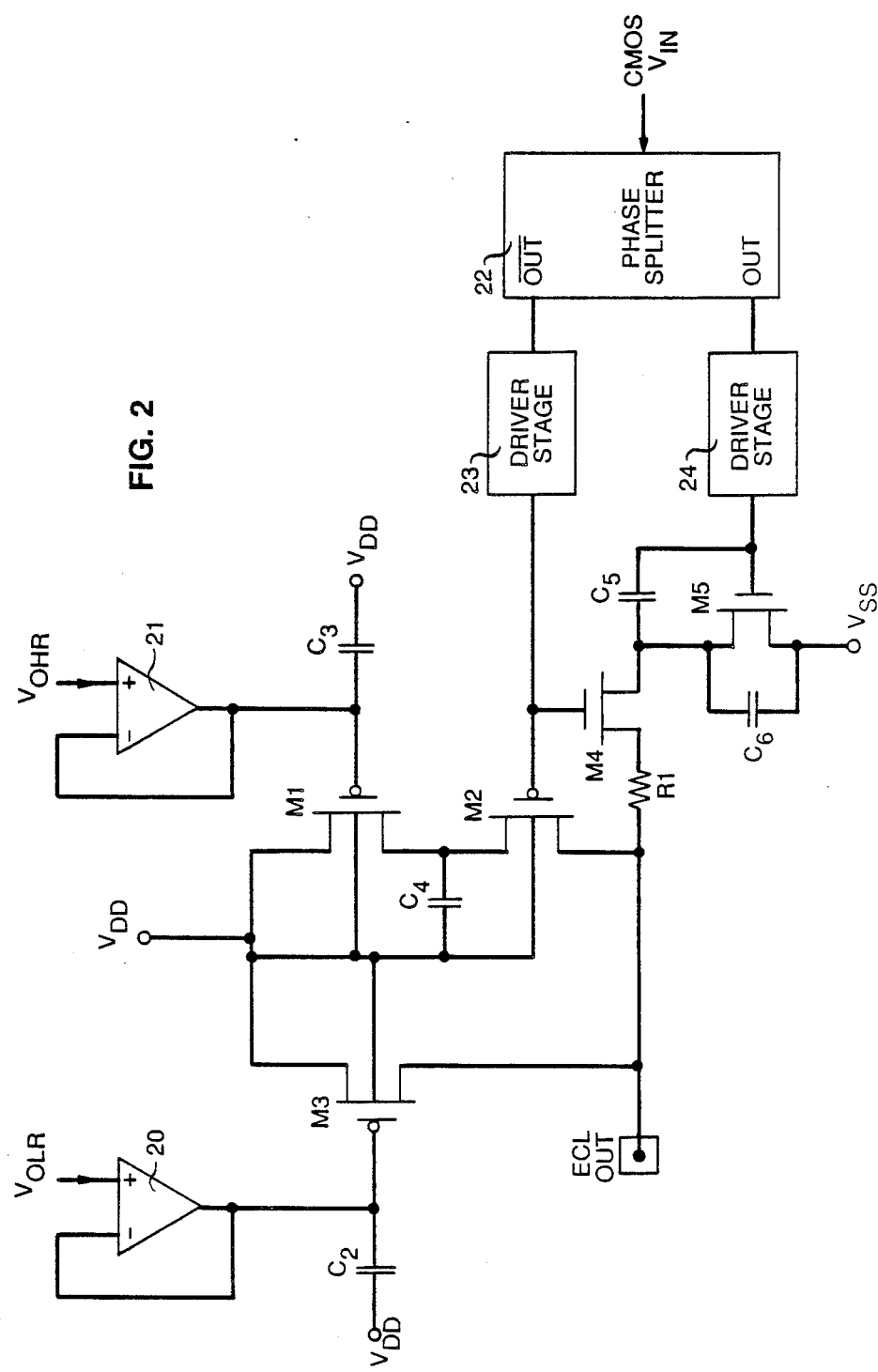
FIG. 2 is a schematic circuit diagram of a portion of the circuit of FIG. 1 in accordance with an embodiment of the invention.

FIG. 2 illustrates in some detail the output buffer circuit 14. The low and high reference voltages, $V_{OLR}$ and $V_{OHR}$, are coupled to the inputs of separate operational amplifiers, 20 and 21, respectively. These amplifiers include feeback loops to the other input for the purpose of creating unity gain buffers. The outputs of these amplifiers, 20 and 21, are coupled to the gates of separate MOS transistors, $M_3$ and $M_1$, respectively. These transistors have their source regions coupled in common to a node at a potential, $V_{DD}$, which, as mentioned above, is the upper driving voltage for the CMOS chip. Capacitors $C_2$ and $C_3$ which are coupled between the gates of $M_3$ and $M_1$ and $V_{DD}$ serve to filter out ripples due to parasitic capacitances on these transistors. Capacitor $C_4$ is coupled between the node at $V_{DD}$ and the source of transistor $M_2$ thereby providing a shunt for transistor $M_1$.

Current flow through the branch of the circuit including transistor $M_1$ is controlled by MOS transistor $M_2$. $M_2$ is turned on or off by a voltage supplied to its gate from the remainder of the CMOS chip (designated CMOS $V_{in}$) through a phase splitter 22 which divides the incoming signal into two signals which are 180 degrees out of phase. One of said signals is amplified by a driver stage 23 and the output of that stage is applied to the gate of $M_2$.

In operation, transistors $M_3$ and $M_1$ are operated in their linear region so that their drains essentially function as non-ideal voltage sources with the output voltage at the node labeled "ECL Out" being a strict function of the voltage applied to their gate electrodes and of the value of the load current through the termination resistor (16 of FIG. 1). The lower voltage level for the ECL output (−1.7 volts) is established when only the branch including M$_3$ is conducting current. When the branch including M$_1$ is conducting, as a result of turning on transistor M$_2$, the voltage at "ECL out" will be the higher level voltage for ECL operation (−0.95 volts). The presence of C$_4$ in the branch including M$_1$ decreases the rise time and lowers impedance at the node by passing most of the current through the capacitor during the ramp up of the current.

Means are also provided in the circuit to reduce charge buildup on transistor M$_2$. These means include an MOS transistor M$_4$ whose gate is coupled to the same driver stage (23) as transistor M$_2$, and an MOS transistor M$_5$ whose gate is coupled to another driver stage, 24, which in turn is coupled to phase splitter 22 and receives a signal 180 degrees out of phase with that of driver 23. The drain of transistor M$_4$ is coupled to the drain of transistor M$_2$ through resistor R$_1$, and the source of M$_4$ is coupled in common with the drain of M$_5$ to driver stage 24 through capacitor C$_5$. Capacitor C$_6$ provides a shunt across transistor M$_5$.

In the operation of this portion of the circuit, when the signal from driver stage 23 ramps up, M$_4$ is made conducting and any charge accumulated on M$_2$ will be sucked through M$_4$, discharging capacitor C$_5$ into driver stage 24 and out through a V$_{SS}$ connection (not shown). When the signal from driver 23 ramps down, M$_4$ is disconnected from M$_2$ while M$_5$ is made conducting by the signal from driver 24. This recharges capacitor C$_5$ so that charge removal can again be effected in the next signal cycle. Capacitor C$_6$ serves as an additional shunt to accumulated charge on the drain of M$_2$ when M$_4$ turns on and M$_5$ turns off.

It will be appreciated that the circuit of FIG. 2 is designed to operate at a high voltage (V$_{DD}$) of 0 volts and a low voltage (V$_{SS}$) of −5 volts compatible with the rest of the CMOS circuitry on the chip. Also, the high and low voltages generated by the circuit for ECL operation should be within a fairly narrow range. A typical specification is a high voltage level between −0.880 and −1.025 volts, and a low voltage level between −1.620 and −1.810. The circuit of the present invention provides sufficient control so that the voltages fall within these ranges.

Figure 3:
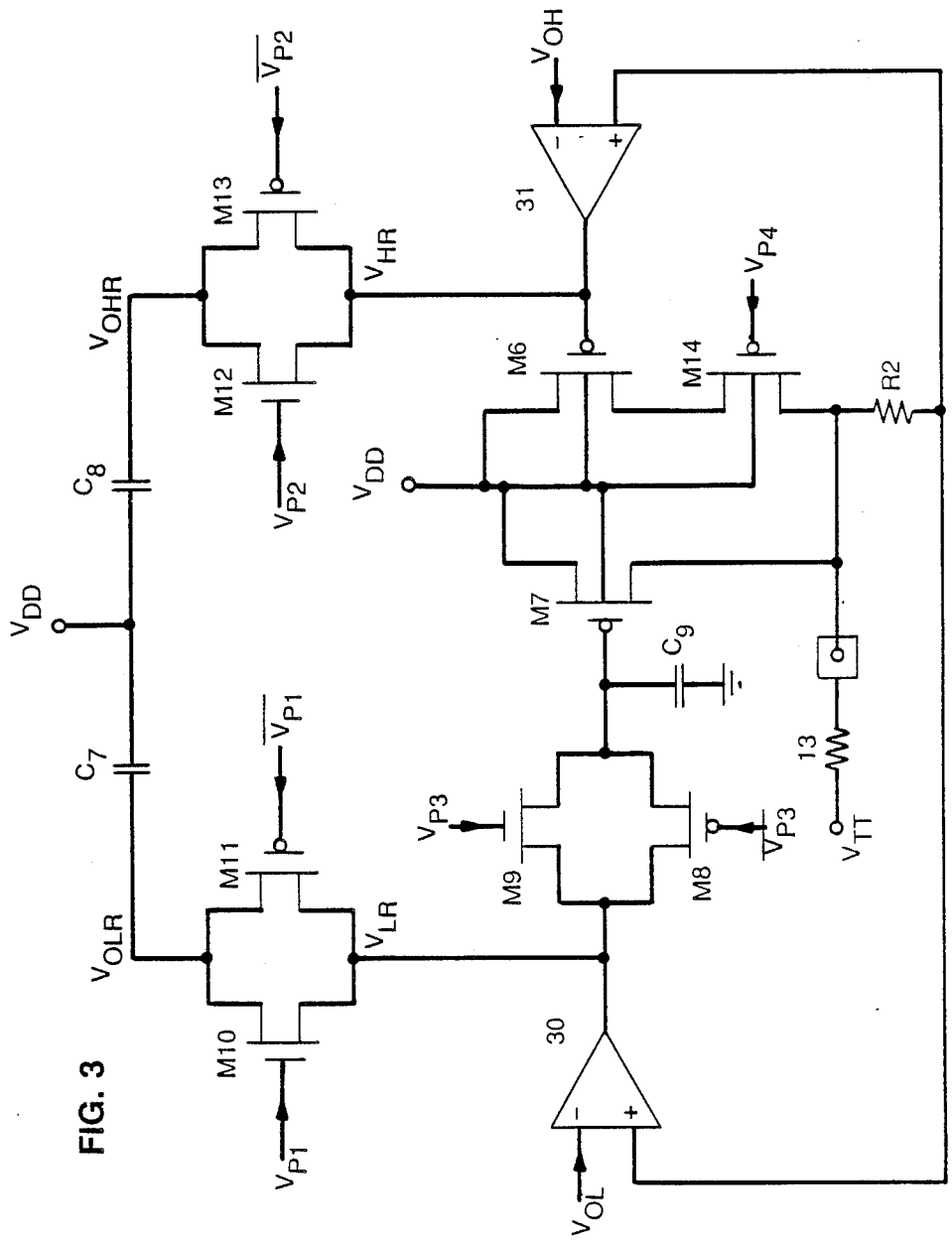
FIG. 3 is another portion of the circuit of FIG. 1 in accordance with an embodiment of the invention.

One example of a circuit for providing stable reference voltages (12 of FIG. 1) is illustrated in FIG. 3. Voltages V$_{OL}$ and V$_{OH}$ from the voltage mirror circuit (11 of FIG. 1) are coupled to the inputs of separate operational amplifiers, 30 and 31. The output of amplifier 30 is coupled, through MOS transistors M$_8$ and M$_9$, to the gate of MOS transistor M$_7$, while the output of amplifier 31 is coupled to the gate of MOS transistor M$_6$. Transistors M$_6$ and M$_7$ are in separate branches coupled in parallel between a node at V$_{DD}$ and a node which is coupled to the reference resistor 13. Current through the branch including M$_6$ is controlled by transistor M$_{14}$ which is coupled to a source of voltage designated as V$_{P4}$. The node coupled to reference resistor 13 is also coupled through resistor R$_2$ to the other inputs of the operational amlifiers, 30 and 31, not coupled to reference voltages V$_{OL}$ and V$_{OH}$. Also coupled to the outputs of operational amplifiers 30 and 31 are transistor pairs, M$_{10}$, M$_{11}$ and M$_{12}$, M$_{13}$, respectively. The output of these pairs are the reference voltages, V$_{OLR}$ and V$_{OHR}$ which are supplied to the output buffer (FIG. 2).

Figure 4:
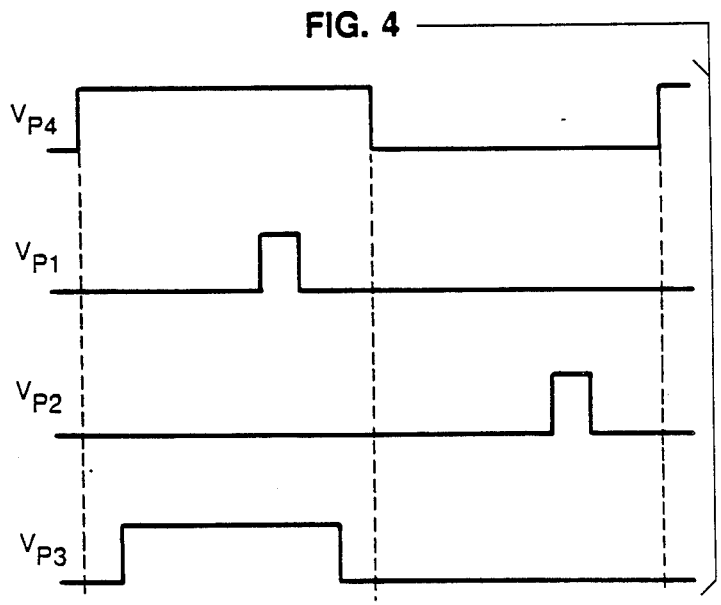
FIG. 4 is an illustration of voltage waveforms for operating the circuit of FIG. 3.

The operation of the reference circuit of FIG. 3 can be understood in conjunction with the voltage waveforms shown in FIG. 4. All voltages vary between a high value of 0 volts (V$_{DD}$) and a low value of −5 volts (V$_{SS}$). A high value of V$_{P4}$ applied to transistor M$_{14}$ renders it nonconductive. This limits current flow between V$_{DD}$ and V$_{TT}$ to the branch of the circuit including M$_7$. The voltage across the reference resistor 13 will be sensed by the input of the operational amplifier, 30, not coupled to voltage V$_{OL}$. Applying a high value of V$_{P3}$ to transistor M$_9$ and voltage $\overline{V_{P3}}$, which is 180 degrees out of phase, to transistor $\overline{M_8}$ connects a negative feedback loop to the operational amplifier 30. This loop includes M$_8$, M$_9$, M$_7$ and R$_2$ in series, and C$_9$ and resistor 13 in parallel therewith. When equilibrium is reached, therefore, the two inputs will be equal and the output V$_{LR}$ will be a stable function of the reference voltage V$_{OL}$ from the voltage mirror (11 of FIG. 1) and the reference resistor (13 of FIG. 1). After equilibrium is reached, a pulse V$_{P1}$ is applied to transistor M$_{10}$ and its opposite $\overline{V_{P1}}$ applied to transistor M$_{11}$ to connect that portion of the circuit. This establishes V$_{OLR}$ at its output and also stores the charge generated by that voltage on capacitor C$_7$. In the next cycle, V$_{P4}$ goes low thereby causing M$_{14}$ to conduct. At the same time, although V$_{P3}$ is low, the gate of M$_7$ is kept at V$_{LR}$ by the stored charge on capacitor C$_9$. This causes conduction through both branches of the circuit, but only the feedback loop to operational amplifier 31 will be activated. This loop includes M$_6$, M$_{14}$ and R$_2$ in series, and M$_7$ and resistor 13 in parallel. The voltage across the resistor, 13, due to the current through both branches is now sensed at the input of amplifier 31 not connected to V$_{OH}$. When equilibrium is reached, the voltage at both inputs will be equal, and the output voltage V$_{HR}$ will be a function of this higher reference voltage. A voltage V$_{P2}$ is applied to M$_{12}$ and $\overline{V_{P2}}$ applied to M$_{13}$ to establish V$_{OHR}$ at the output and to store charge corresponding to this voltage on capacitor C$_8$.

Thus, the circuit of FIG. 3 performs alternate sampling of the high and low reference voltages, V$_{OH}$ and V$_{OL}$, across the reference resistor 13 by means of feedback loops to the amplifiers 30 and 31. This scheme allows a single reference resistor to be utilized. However, it should be realized that the invention could be used with two reference resistors, if desired, in which case two separate, continuously operating feedback loops would be used.

Various additional modifications will become apparent to those skilled in the art. All such variations which basically rely on the teachings through which the invention has advanced the art are properly considered within the scope of the invention.

We claim:
1. An output buffer circuit comprising:
 a first MOS transistor in a first branch of the circuit;
 a second MOS transistor in a second branch of the circuit;
 a third MOS transistor in said second branch of the circuit and coupled to turn on and off the current through said second branch;
 the two branches being coupled in parallel so that the output voltage of the first branch when current in the second branch is turned off provides one voltage level for an emitter coupled logic circuit connected to the output of the branches, and the output voltage of the two branches when the current in the second branch is turned on provides another voltage level of the emitter coupled logic circuit connected to the output;

said transistors being integrated into a single semiconductor chip;

a resistor external to said chip of supplying reference voltages to said output buffer circuit; and a reference circuit including feedback loops to separate operational amplifiers for establishing high and low reference voltages applied to the output buffer in accordance with voltages across said external resistor.

2. The circuit according to claim 1 wherein the external resistor is coupled to the output buffer circuit through a sampling reference circuit.

3. The circuit according to claim 1 wherein the feedback loops are coupled to two branches of the reference circuit, one branch including a fourth MOS transistor and the other branch including a fifth and sixth MOS transistor, one of said fifth and sixth transistors controlling the current through that branch so that a first reference voltage is established when a current flows through one branch and a second reference voltage is established when a current flows through both of the branches.

4. The circuit according to claim 1 wherein the gates of the first and second transistors are coupled to separate operational amplifiers which are for coupling to high and low reference voltages.

5. The circuit according to claim 1 further comprising means for removing charge buildup on said third transistor.

6. The circuit according to claim 1 wherein one voltage level is within the range −0.880 to −1.025 volts and the other voltage level is within the range −1.620 to −1.810 volts.

7. The circuit according to claim 1 wherein the third transistor is coupled so as to receive voltages at its gate within the range 0 to −5 volts.

8. The circuit according to claim 1 further comprising a shunt capacitor connected across the source and drain of the second transistor.

9. The circuit according to claim 4 wherein the first and second transistors are such that, when a bias is supplied thereto, they will operate as essentially non-ideal voltage sources.

10. The circuit according to claim 1 wherein the said external resistor is coupled so as to receive the same voltage as a termination resistor coupled through a transmission path coupled to the output of said buffer circuit.

* * * * *

UNITED STATES PATENT AND TRADEMARK OFFICE
CERTIFICATE OF CORRECTION

PATENT NO.  : 4,947,061

DATED       : August 7, 1990

INVENTOR(S) : Peter C. Metz and Robert L. Pritchett

It is certified that error appears in the above-identified patent and that said Letters Patent is hereby corrected as shown below:

Column 2, line 10, "illustrates and" should read --illustrates an--. Column 3, line 5, "ECL out" should read --ECL Out--. Column 4, line 10, "$\overline{M_8}$" should read --$M_8$--; line 67, "of the emitter" should read --for the emitter--.

Signed and Sealed this

Thirty-first Day of March, 1992

Attest:

HARRY F. MANBECK, JR.

Attesting Officer          Commissioner of Patents and Trademarks